United States Patent

[11] 3,627,902

[72] Inventors Steven C. Meyers
Burnsville;
Larry G. Bergman, Minneapolis, both of Minn.

[21] Appl. No. 7,656
[22] Filed Feb. 2, 1970
[45] Patented Dec. 14, 1971
[73] Assignee Control Data Corporation
Minneapolis, Minn.

[54] INTERCONNECTIONS FOR MULTILAYER PRINTED CIRCUIT BOARDS
6 Claims, 5 Drawing Figs.

[52] U.S. Cl. ........................................................ 174/68.5, 29/625, 156/150, 317/101 CM
[51] Int. Cl. ........................................................ H05k 1/10
[50] Field of Search ........................................... 174/68.5; 317/101 B, 101 CM, 101 D; 339/17 E; 29/625–628; 204/15; 156/3, 150

[56] References Cited
UNITED STATES PATENTS
3,276,106 10/1966 Bester et al. .................. 174/68.5 X

*Primary Examiner*—Darrell L. Clay
*Attorneys*—Richard P. Ulrich, Thomas G. Devine, Joseph A. Genovese and Paul L. Sjoquist

ABSTRACT: A reliable mechanical and electrical connection between interior conductive layers and exterior conductive layers of a multilayer printed circuit board is provided. Shoulders are formed on the internal conductive layers at the location where connection is desired. A hole is then drilled through the assembly, passing through the shoulder. The wall of the hole is then electroformed with a conductive metal which makes connection at the formed shoulder. The added thickness of the shoulder combined with the pad area on the interior conductive layer provides a relatively large area and a more reliable interconnection.

INVENTORS
STEVEN C. MEYERS
LARRY G. BERGMAN
BY Thomas G. Devine
ATTORNEY

INTERCONNECTIONS FOR MULTILAYER PRINTED CIRCUIT BOARDS

BACKGROUND OF THE INVENTION

This relates to miniaturized electronic circuits. More specifically, it relates to the electrical connection required between electronic components. The connections are formed by laying down conductive paths on a nonconductive base. However, the miniaturization of components has made it necessary to form these conductive paths in more than one plane. The multilayer printed circuit board provides facility for a much more dense population of electronic components for a given area than a single plane.

Making connections to conductive paths which are internal to a multilayer printed circuit board is a difficult problem. To meet the size requirements for miniaturization of electronic circuits, the multilayer printed circuit board must necessarily be quite small and its conductors must be very thin. A very common practice has been to connect to these internal conductors by drilling a hole at the appropriate place and plating the wall of the hole so that electrical connection is made between layers of conductors. Where thin conductors are used (e.g. 0.0014-inch thick copper), the thickness of the conductors makes connection between the plated wall of the hole and the conductor very difficult. During the drilling operation some of the insulating material between conductive layers may smear across the conductive layers because they are so thin. This smear causes difficulty in making a good connection.

There have been numerous attempts to solve this problem. One attempt involves removing part of the insulating material from the wall of the feed-through hole prior to plating. In that way a portion of the top and bottom as well as the end of the conductive layer can be plated, providing a much larger area for connection. Another attempt at solution involves removing part of the conductive material from the wall of the feed-through hole prior to plating. The plating takes the form of a flange at the point of contact with each conductive layer which has been etched back. The flange makes connection with the conductive layer and is mechanically supported by the insulating layers.

SUMMARY OF THE INVENTION

Shoulders (raised areas) are formed on the internal conductive layers in a pattern to correspond with the desired pattern of feed-through holes. The feed-through holes are drilled through the circuit board passing through the internal shoulders. Very good mechanical strength is thus provided without increasing the overall dimensions of the multilayer printed circuit board. Further, an area much larger than that of the end of the internal conductive layer is provided for electrical connection.

It is therefore an object of this invention to provide a highly reliable multilayer printed circuit board.

Another object is to provide a highly reliable mechanical and electrical connection between internal conductive layers of a multilayer printed circuit board and the conductive coating of the wall of a feed-through hole.

Another object is to provide reliable electrical connection between the internal conductive layers of a multilayer printed circuit board and external conductive layers.

Still another object is to provide mechanical rigidity such that the connection made between an internal conductive layer and the conductive coating of the wall of the feed-through hole will not easily separate when stress is applied to the multilayer printed circuit board.

Further objects and advantages will be ascertained from an understanding of the description of the illustrative embodiment of the invention and from the appended claims.

DESCRIPTION OF THE PREFERRED EMBODIMENT

Figure 1:
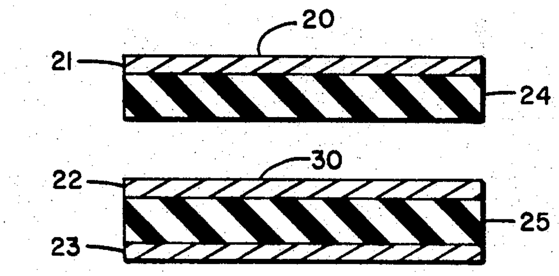
FIG. 1 is a vertical section view of the component parts from which the multilayer printed circuit board originates.

Referring to FIG. 1, it can be seen that one of the component parts of the multilayer printed circuit board is represented generally by the numeral 20 and is comprised of conductive layer 21 and insulating layer 24. The other component part is represented generally by the numeral 30 and is comprised of conductive layers 22 and 23, and insulating layer 25. The conductive layers 21, 22 and 23 are typically made of copper. The insulating layers 24 and 25 are typically made of epoxy-glass composition sheets. Of course, metals other than copper could be used, plated or unplated, and insulating material other than epoxy-glass could also be used. In the preferred embodiment, the combination of conductive layer 21 and insulating layer 24 comprises a commercially available copper clad laminate. The combination of conductive layers 22 and 23, and insulating layer 25 comprises another form of commercially available copper clad laminate sometimes referred to as double copper clad laminate.

Figure 2:
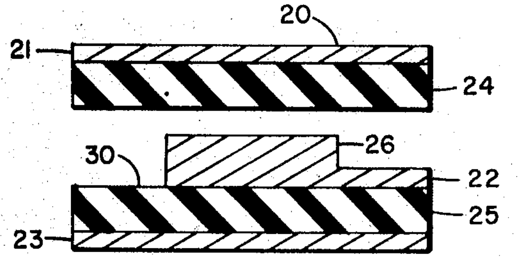
FIG. 2 is a vertical section view of a circuit having a shoulder (raised area) at the location where a feed-through hole is to be subsequently drilled.

FIG. 2 shows conductive layer 22 etched in a conventional manner to a desired circuit pattern. This is done by applying a conventional photoresist material which is selectively exposed to light in a pattern conforming with the desired printed circuit to be produced. Such photoresist materials react to light such that the unexposed areas can be removed with a standard developer. On application of the developer, followed by an etching step, a conductive circuit pattern is formed of conductive layer 22.

FIG. 2 also illustrates conductive shoulder 26 deposited on conductive layer 22. The formation and deposition of shoulder 26 is accomplished by first covering the resultant conductive circuit pattern of conductive layer 22 and the surface of insulating layer 25, exposed by the aforementioned etching step, with a very thin film of copper (not shown) by a well-known electroless deposition shown.

The copper film is then coated with a masking material which conforms tightly to the contours of the conductive circuit pattern and which can be photodeveloped in the pattern of the conductive shoulder 26. The masking material is photographically exposed and developed to leave an aperture corresponding to the size and position of the conductive shoulder 26 using the copper film as an electrode. Conductive shoulder 26 is now deposited on internal conductive layer 22 by way of an electroforming procedure. The mask and the copper film are then removed using a conventional stripper. Conductive shoulder 26 may be as thin as 0.001 inch regardless of the thickness of internal conductive layer 22. This method of forming the conductive shoulder is taught in detail in copending U.S. Pat. application, Ser. No. 648,576, filed on June 26, 1967, entitled "Multilayer Printed Circuit and Method Of Manufacturing Same," now Pat. No. 3,496,072.

Figure 3:
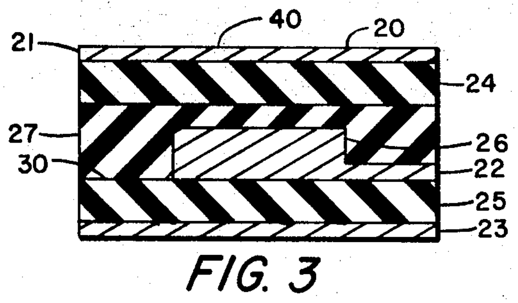
FIG. 3 is a vertical section view illustrating the printed circuit board as a laminated package or multilayer printed circuit board.

Referring now to FIG. 3, it can be seen that the copper clad laminate 20 has been connected to the altered double copper clad laminate 30. The connection is made by the use of an adhesive, partially cured epoxy-glass which forms insulating layer 27. Heat and pressure are applied to laminates 20 and 30 which forces them together and cures insulating layer 27 to form a contiguous multilayer printed circuit board shown generally as 40.

Figure 4:
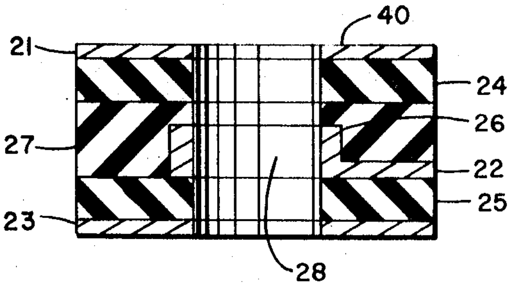
FIG. 4 is a vertical section view of the multilayer printed circuit board with a feed-through hole drilled through it, passing through the shoulder.

In FIG. 4, a further step in the manufacture of this multilayer printed circuit board is illustrated. An aperture for a feed-through hole is drilled and is shown as numeral 28.

Figure 5:
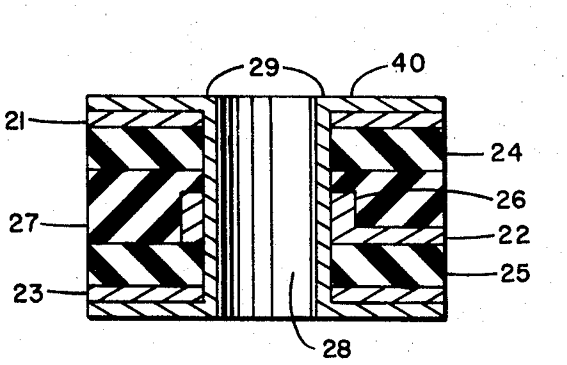
FIG. 5 is a vertical section view of the multilayer printed circuit board with the application of a conductive coating on the wall of the feed-through hole.

FIG. 5 illustrates a vertical section of a finished multilayer circuit board with a completed feed-through hole. Conductor 29 connects conductive layer 23 to conductive shoulder 26 which in turn is connected to conductive layer 22. Conductor 29 continues to conductive layer 21 and is connected thereto. Conductor 29 is formed by a first electroless deposition of a very thin film of copper on the inside wall of aperture 28 and ordinarily on conductive layers 21 and 23. Copper conductor 29 is electroplated over the electroless copper film including conductive layers 21 and 23 which may have been prepared so that the copper now added follows a prescribed pattern. The greater size of the connection between conductive shoulder 26 and conductor 29 provides ample area to overcome the problems inherent in electrically connecting inner conductors together and with outer conductors. Conductive layers 21 and 23 may now be etched into circuit patterns if desired, by conventional techniques. It should be noted that, although the connection problems with the external conductive layers are not as severe in the case of the internal conductive layers, a conductive shoulder can be formed on conductive layer 23 and on conductive layer 21 in the same fashion as described for conductive shoulder 26.

Those skilled in the art will appreciate that the preferred embodiment is simply one way of obtaining the desired result. For example, conductive shoulder 26 could be formed by using a thicker internal conductive layer and etching away all copper except conductive shoulder 26 and internal conductive layer 22. Another etch on conductor 22 could be performed to develop a printed circuit pattern. Also, the feed-through hole, which is sometimes referred to as a plated-through hole, could have been developed by forming a post within the aperture 28 and then drilling through the post.

We claim:

1. A multilayer printed circuit board comprising:
   a. a plurality of insulating layers:
   b. a plurality of conductive layers, at least one of which is internal and sandwiched between two of the insulating layers;
   c. at least one feed-through hole whose wall has an electrically conductive coating and which penetrates all of the insulating layers and all of the conductive layers; and
   d. a formed shoulder integral with and upon the internal conductive layer, surrounding the feed-through hole and creating thereabout a thickened section of the internal conductive layer, having at least its periphery overlapped by the adjacent insulating layer, and electrically and mechanically connected with the conductive coating in the hole.

2. The invention of claim 1 wherein the electrically conductive coating of the wall of the feed-through hole is an electroplated metal.

3. The invention of claim 1 wherein the formed shoulder is electroplated metal.

4. A multilayer printed circuit board comprising:
   a. at least two insulating layers;
   b. at least three conductive layers, one of which is internal and sandwiched between said two insulating layers,
   c. at least one feed-through hole whose wall is electroplated with electrically conductive metal and which penetrates all insulating layers and all conductive layers; and
   d. an electroplated shoulder, integral with and upon the internal conductive layer, surrounding the feed-through hole and creating thereabout a thickened section of the internal conductive layer, having at least its periphery overlapped by the adjacent insulating layer, and electrically and mechanically connected to the electroplated wall.

5. The invention of claim 4 wherein the electroplated shoulder is at least 0.001 inches in thickness.

6. A method of manufacturing a multilayer printed circuit board comprising the steps of:
   a. forming a first conductive circuit pattern on an insulating layer;
   b. conforming a masking material to the contours of the conductive circuit pattern;
   c. forming at least one aperture in the masking material;
   d. electroforming a conductive shoulder within at least one aperture in the masking material;
   e. removing the masking material, resulting in a completed subassembly;
   f. connecting the subassembly to the insulating layer side of an insulating layer having a conductive layer affixed thereto;
   g. forming at least one feed-through hole passing through the conductive shoulder; and
   h. forming a conductive coating on the wall of the feed-through hole on both the conductive layers and the insulating layers.

* * * * *